(12) United States Patent
Lipo et al.

(10) Patent No.: US 12,289,071 B2
(45) Date of Patent: *Apr. 29, 2025

(54) INDUCTION MACHINE WITH LOCALIZED VOLTAGE UNBALANCE COMPENSATION

(71) Applicants: The Florida State University Research Foundation, Inc., Tallahassee, FL (US); Carl Lipo

(72) Inventors: Thomas A. Lipo, Vestal, NY (US); Akihiro Imakiire, Kitakyushu Fukuoka (JP)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/452,176

(22) Filed: Aug. 18, 2023

(65) Prior Publication Data

US 2023/0396205 A1 Dec. 7, 2023

Related U.S. Application Data

(63) Continuation of application No. 16/871,020, filed on May 10, 2020, now Pat. No. 11,863,100.

(60) Provisional application No. 62/846,316, filed on May 10, 2019.

(51) Int. Cl.
*H02P 29/024* (2016.01)
*G01R 31/34* (2020.01)
*H02K 15/16* (2006.01)
*H02K 15/165* (2025.01)
*H02P 1/26* (2006.01)

(52) U.S. Cl.
CPC ........ *H02P 29/0241* (2016.02); *G01R 31/343* (2013.01); *H02K 15/165* (2013.01); *H02P 1/26* (2013.01)

(58) Field of Classification Search
CPC ..... H02P 29/0241; H02P 1/26; G01R 31/343; H02K 15/165
See application file for complete search history.

(56) References Cited

U.S. PATENT DOCUMENTS

| | | | | |
|---|---|---|---|---|
| 5,969,957 | A * | 10/1999 | Divan | H02M 5/458 363/36 |
| 9,379,657 | B2 | 6/2016 | Lipo et al. | |
| 10,003,195 | B1 * | 6/2018 | Wong | H02J 3/1864 |
| 2008/0309282 | A1 * | 12/2008 | Morris | H02P 29/02 318/779 |

OTHER PUBLICATIONS

Imaklire et al., "Induction Machine with Localized Voltage Unbalance Compensation," 2019 IEEE International Electric Machines & Drives Conference (IEMDC), San Diego, CA, USA, 2019, pp. 1248-1255.

(Continued)

*Primary Examiner* — Zoheb S Imtiaz
(74) *Attorney, Agent, or Firm* — Eversheds Sutherland (US) LLP

(57) ABSTRACT

An induction machine with localized voltage unbalance compensation is disclosed. The use of an induction machine with a voltage unbalance correction compensator (VUC) may be used to maintain proper working conditions of the machine during intervals of voltage unbalance.

17 Claims, 13 Drawing Sheets

(56) References Cited

OTHER PUBLICATIONS

Ted K.A. Brekken et al., "Control of a Doubly Fed Induction Wind Generator Under Unbalanced Grid Voltage Conditions," IEEE Transactions on Energy Conversion, vol. 22, No. 1, pp. 129-135, Mar. 2007.

P. S. Flannery et al., "Unbalanced Voltage Sag Ride-Through of a Doubly Fed Induction Generator Wind Turbine with Series Grid-Side Converter," IEEE Transactions on Industry Applications, vol. 45, No. 5, pp. 1879-1887, Sep./Oct. 2009.

P. S. Virk "Investigation of Unity Power Factor (UPF) Operation of an Open Winding Induction Machine," Master of Science project report, University of Wisconsin-Madison, pp. 1-88, May 2012.

D. B. Rathnayake, et al., "A Dual Purpose Induction Motor Drive for a High Inertia Load with Both Quick Run-Up and Power Factor Correction Capability," 2017 IEEE 3rd International Future Energy Electronics Conference and ECCE Asia (IFEEC 2017—ECCE Asia), pp. 388-393, Jun. 2017.

A.M. Knight, et al., "A Grid-Connected Induction Machine Capable of Operation at Unity and Leading Power Factor," 2013 IEEE Energy Conversion Congress and Exposition, pp. 238-245, Sep. 2013.

E. Muljadi, et al., "Induction Machine Phase Balancing by Unsymmetrical Thyristor Voltage Control," IEEE Transactions on Industry Applications, vol. IA-21, No. 4, pp. 669-678, May/Jun. 1985.

P. G. Cummings, et al., "Protection of Induction Motors Against Unbalanced Voltage Operation" IEEE Transactions on Industry Applications, vol. IA-21, No. 4, pp. 778-792, May/Jun. 1985.

J. Faiz, et al., "Influence of Unbalanced Voltage on the Steady-State Performance of a Three-Phase Squirrel-Cage Induction Motor," IEEE Transactions on Energy Conversion, vol. 19, No. 4, pp. 657-662, Dec. 2004.

Y-J Wang "Analysis of Effects of Three-Phase Voltage Unbalance on Induction Motors with Emphasis on the Angle of the Complex Voltage Unbalance Factor," IEEE Transactions on Energy Conversion, vol. 16, No. 3, pp. 270-275, Sep. 2001.

P. Pillay, et al., "Loss of Life in Induction Machines Operating With Unbalanced Supplies," IEEE Transactions on Energy Conversion, vol. 21, No. 4, pp. 813-822, Dec. 2006.

D. W. Novotny, T. A. Lipo and T. M. Jahns, "Introduction to Electric Machines and Drives," (book) Wisconsin Power Electronics Research Center, University of Wisconsin-Madison, Chapter 3 Basic Induction Machine Theory, pp. 79-115, 2009.

\* cited by examiner

INDUCTION MACHINE WITH LOCALIZED VOLTAGE UNBALANCE COMPENSATION

CROSS-REFERENCE TO RELATED APPLICATION(S)

This application is a continuation of U.S. Non-Provisional application Ser. No. 16/871,020 filed May 10, 2020, which claims the benefit of U.S. Provisional Application No. 62/846,316, filed May 10, 2019, the disclosure of which is incorporated herein by reference as if set forth in full.

TECHNICAL FIELD

The present disclosure generally relates to voltage unbalance corrections for machines.

BACKGROUND

In recent years, various types of Alternating Current (AC) machines have been developed for achieving higher efficiency, power density, and/or speed. In spite of this, induction machines (e.g., squirrel-cage induction machines) remain by far the most commonly used AC machine. For example, the Japanese department of ministry of economy, trade, and industry has reported that 80% of AC machines utilized in Japan are induction machines. This may be because induction machines continue to be cheap and durable options. The main uses of induction machines are for fans, blowers, pumps, and compressors, but may also be used in heavy industry applications such as cooling equipment, air conditioning, and various processes in factories or power plants. Such induction machines, however, may be sensitive to voltage unbalances and also voltage harmonics, which, for example, may be caused by nearby solid-state equipment. Generally, a voltage unbalance of only 5% may cause the induction machine to lose 25% of its load supplying capability. Voltage unbalances are typically caused by single-phase loads, or unbalanced impedance loads along feeder lines on a power grid. These voltage unbalances may cause a number of problems, such as over-load currents, local heating, noise, and vibration in connected induction machines. As a result, associated equipment might operate in a lengthy overload condition which may even result in failure of the machine and consequently the connected load.

It is known that unbalanced voltage conditions can be compensated on the electrical grid by using external power electronic equipment such as a static VAR compensator (SVC), but at the penalty of substantial cost, space, and maintenance. Overall, the electrical grid may not typically need additional power electronic equipment to correct for an unbalance except for specific induction machines on the grid. If induction machines feeding critical loads can continue operating even when such intervals occur, it may offer great advantages for reliability of the grid supplying heavy industry.

When using a doubly fed induction machine (DFIM), a secondary coil and a power converter can be used to prevent drive failure during voltage unbalance. For a squirrel-cage induction machine, an open winding squirrel-cage induction machine, combined with an inverter has been proposed to improve power factor in heavy industry. Other conventional solutions may use compensation method in which thyristors are set between power grid source and stator winding. Overall, however, there has been little research into voltage unbalance prevention when using squirrel-cage induction machines. Typically, an oversize induction machine that can tolerate a derating caused by voltage unbalance has been utilized because an over-current relay cannot protect a squirrel-cage induction machine from voltage unbalance. However, this leads to increases in size and cost. In addition, this approach cannot prevent the voltage unbalance which results in current unbalance and torque fluctuation. In general, both the squirrel-cage induction machine and its load might be seriously damaged by the voltage unbalance.

BRIEF DESCRIPTION OF THE DRAWINGS

The detailed description is set forth with reference to the accompanying drawings. The use of the same reference numerals indicates similar or identical components or elements; however, different reference numerals may be used as well to indicate components or elements which may be similar or identical. Various embodiments of the disclosure may utilize elements and/or components other than those illustrated in the drawings, and some elements and/or components may not be present in various embodiments. Depending on the context, singular terminology used to describe an element or a component may encompass a plural number of such elements or components and vice versa.

Figure 1:
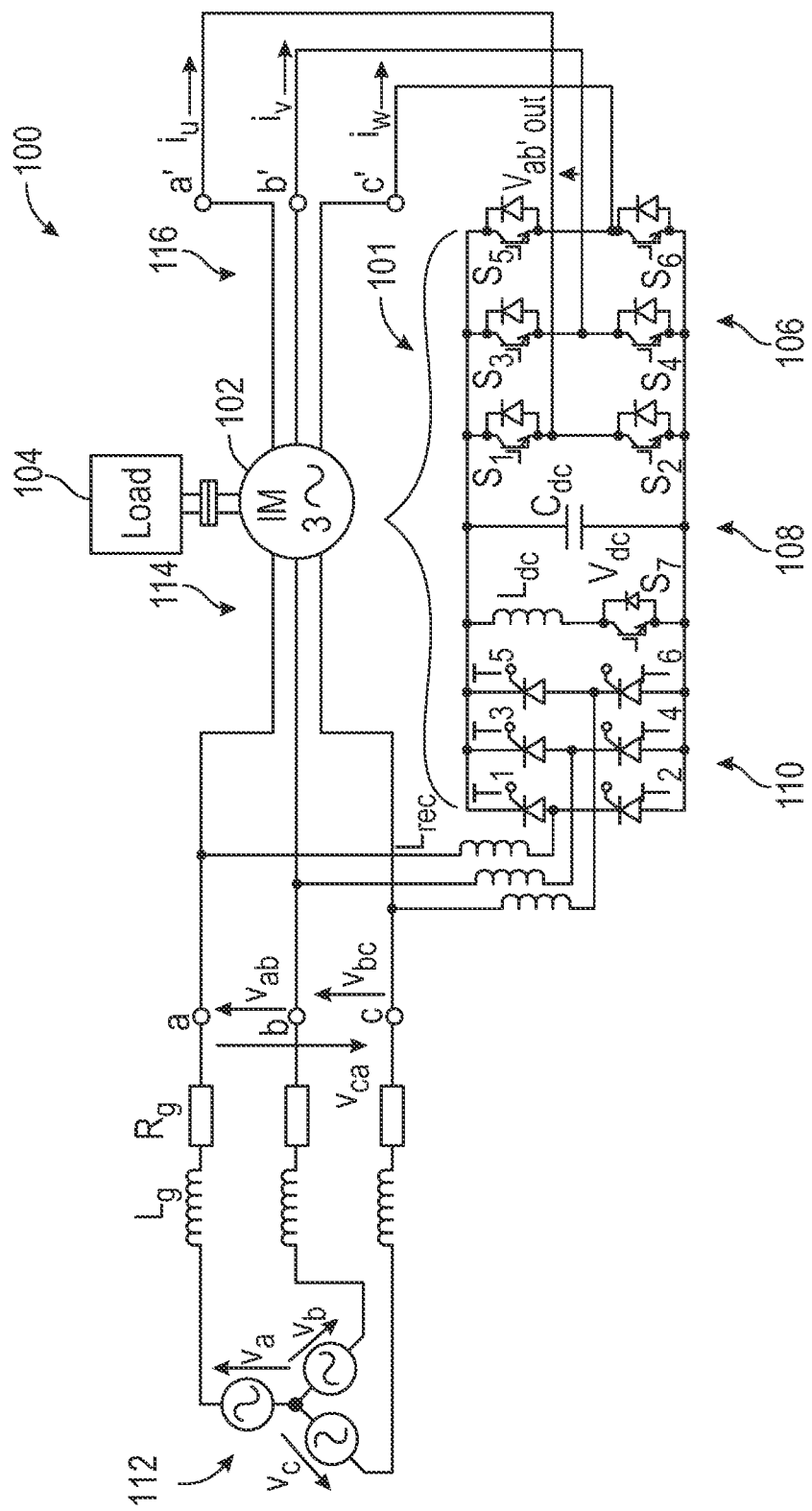
FIG. 1 depicts a circuit diagram of an induction machine equipped with Voltage Unbalance Compensator (VUC) in accordance with one or more example embodiments of the disclosure.

The diagrams depicted herein are illustrative. There can be many variations to the diagram or the operations described therein without departing from the spirit of the disclosure. For instance, the actions can be performed in a differing order, or actions can be added, deleted, or modified.

In the accompanying figures and following detailed description of the described embodiments, the various elements illustrated in the figures are provided with two or three-digit reference numbers. With minor exceptions, the leftmost digit(s) of each reference number corresponds to the figure in which its element is first illustrated.

DETAILED DESCRIPTION

Disclosed herein is an induction machine (it should be noted that the terms "machine," "motor," and "induction machine" may be used interchangeably herein) with localized voltage unbalance compensation (VUC). In particular, the present disclosure may relate to a VUC device that may be used in conjunction with the induction machine and may correct for a voltage unbalance in the induction machine resulting from a voltage source feeding the induction machine. For example, the VUC may correct for the voltage unbalance in the induction machine by providing a supplemental voltage to compensate for a voltage unbalance. The VUC may be connected to the machine in parallel. This may allow the VUC to receive any voltages being applied to the induction machine by the voltage source in parallel with the induction machine so that the VUC may identify voltage unbalances in voltages being received by the induction machine. The VUC may improve the functionality of the machine by maintaining proper working conditions of the machine during intervals of voltage unbalance.

Also disclosed herein is a control method for operating the VUC as well as simulation results that confirm the validity of the control method. The results show that the VUC may allow a machine to maintain performance with balanced, rated voltage even during most voltage unbalanced conditions, as well as conditions of symmetrical voltage sags or surges. To ensure that the VUC is able to compensate for an unbalance when a source voltage drops to a low value, the VUC may be provided with additional power so that a thyristor bridge (described below) may have enough power to allow the VUC to function.

In some embodiments, the VUC may also provide additional benefits beyond the benefits described above. For example, the VUC may eliminate harmonic current flow within the machine. This may be accomplished by modification of control signals fed to the VUC, and may be nearly a zero-cost addition, which may add significant value to the overall concept. The VUC may also improve a power factor as viewed at the terminals of the machine (e.g., by supplying a leading voltage in series with the machine). The power factor of squirrel-cage induction machines operating without a VUC may normally be poor, typically 0.8-0.9. This, in turn, may cause the current required to power the machine to rise to values between 10 and 20% beyond is optimal value at unity power factor. While operation at these lagging power factors is inherent to the machine torque production, the 10-20% increase in current may cause the power utility to encounter a corresponding loss in their distribution, transformers, and distribution lines as a result. Consequently, industries are typically charged a penalty for a power factor poorer than unity. However, by use of the VUC the machine can be controlled to present itself as a unity power factor load to the utility regardless of the loading condition of the motor. Again, this feature can be incorporated in the VUC circuit simply by modification of the VUC digital controller at nearly zero additional cost. In addition, the presence of a VUC can be used to ease the shock of starting the machine by reducing inrush current. The VUC may also only need to supply the voltage difference between the desired voltage and the actual unbalanced voltage. Hence, the compensation range for the unbalanced voltages may be wider compared against typical unbalance-correcting systems. Furthermore, because the VUC is in parallel with the induction machine, the induction machine may essentially function the same as if the VUC were not present, which results in ease in implementing the VUC into induction machines.

In some embodiments, the VUC may provide even further benefits in that it may only need be rated only at a fraction of the rating of the induction machine. For example, in the case of a five percent voltage unbalance, the volt-ampere rating of the VUC need be only rated at roughly five percent of the induction machine rating that it is protecting. Thus, the VUC may be a low-cost means of maintaining 100% motor load capability even in the presence of a five percent voltage unbalance. The circuit principle is not limited to a five percent unbalance but can correct for as much as a 25% voltage unbalance or more.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. Moreover, to avoid obscuring the present disclosure, some well-known system configurations and process steps may not be disclosed in full detail. Likewise, the drawings showing embodiments of the disclosure are semi-diagrammatic and not to scale and, particularly, some of the dimensions may be exaggerated in the drawings for the clarity of presentation. In addition, where multiple embodiments are disclosed and described as having some features in common, for clarity and ease of illustration, description, and comprehension thereof, similar and like features will ordinarily be described with like reference numerals even if the features are not identical.

"An embodiment," "various embodiments," and the like indicate embodiment(s) so described may include particular features, structures, or characteristics, but not every embodiment necessarily includes the particular features, structures, or characteristics. Some embodiments may have some, all, or none of the features described for other embodiments. "First," "second," "third," and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements cooperate or interact with each other, but they may or may not be in direct physical or electrical contact. Also, while similar or same numbers may be used to designate same or similar parts in different figures, doing so does not mean all figures including similar or same numbers constitute a single or same embodiment.

The terms "perpendicular," "orthogonal," "coplanar," and/or "parallel" may mean substantially perpendicular, orthogonal, coplanar, or parallel, respectively. For example, "perpendicular" can mean perpendicular within ±20, 15, 10, or five degrees. Further, the figures shown herein may not have precisely vertical or horizontal edges but rather may have some finite slope and have surface roughness, as is to be expected for fabricated devices. The terms "about," "substantially," "approximately," and variations thereof, are intended to include a degree of error associated with a measurement of the particular quantity using equipment available at the time of filing the application. For example, "about" can include a range of ±eight percent or five percent, or two percent of a given value.

Example Systems and Associated Architecture

Turning to the figures, FIG. 1 depicts a circuit diagram for a machine 102 equipped with a Voltage Unbalance Compensator (VUC) 101 in accordance with one or more example embodiments of the disclosure. In some instances, the machine 102 may be an induction machine. The VUC 101 may include a Pulse Width Modulation (PWM) inverter 106, thyristor bridge 110, and DC link capacitor and discharge circuit 108. The VUC 101 may be connected in parallel with stator windings of the machine 102. The VUC 101 may also be connected to a control system (e.g., control system 200 shown in FIG. 2).

In some embodiments, the VUC 101 may serve to correct for voltage unbalances originating from a voltage source 112. The voltage source 112 may provide a three-phase voltage to a first input 114 of the machine 102. In some instances, a voltage unbalance may mean that the voltages on each line of the three-phase voltage applied to the first input 114 of the machine 102 may not be the same. Voltage unbalances at the first input 114 of the machine 102 may result in suboptimal functionality of the machine 102. For example, a voltage unbalance may result in a significant increase in the amount of current applied to the machine 102, which may potentially be damaging to the machine 102. The VUC 101 may mitigate the impact of such voltage unbalances from the voltage source 112. To accomplish this, the VUC 101 may be connected to the machine 102 in parallel such that the voltage received from the voltage source 112 by the machine 102 may also be received by the VUC 101. Based on this received voltage from the voltage source 112, the VUC 101 may determine the amount of voltage unbalance from the voltage source 112 (e.g., voltage unbalance across any of the three phases of the three-phase voltage) and produce a compensating output voltage to a second input 116 of the machine 102 to partially or fully correct for the unbalanced voltage (e.g., three-phase voltage) provided to the first input 114 of the machine 102 by the voltage source 112. At least some of the circuit elements of the VUC 101 may be described in further detail with reference to FIG. 3 below.

Figure 2A:
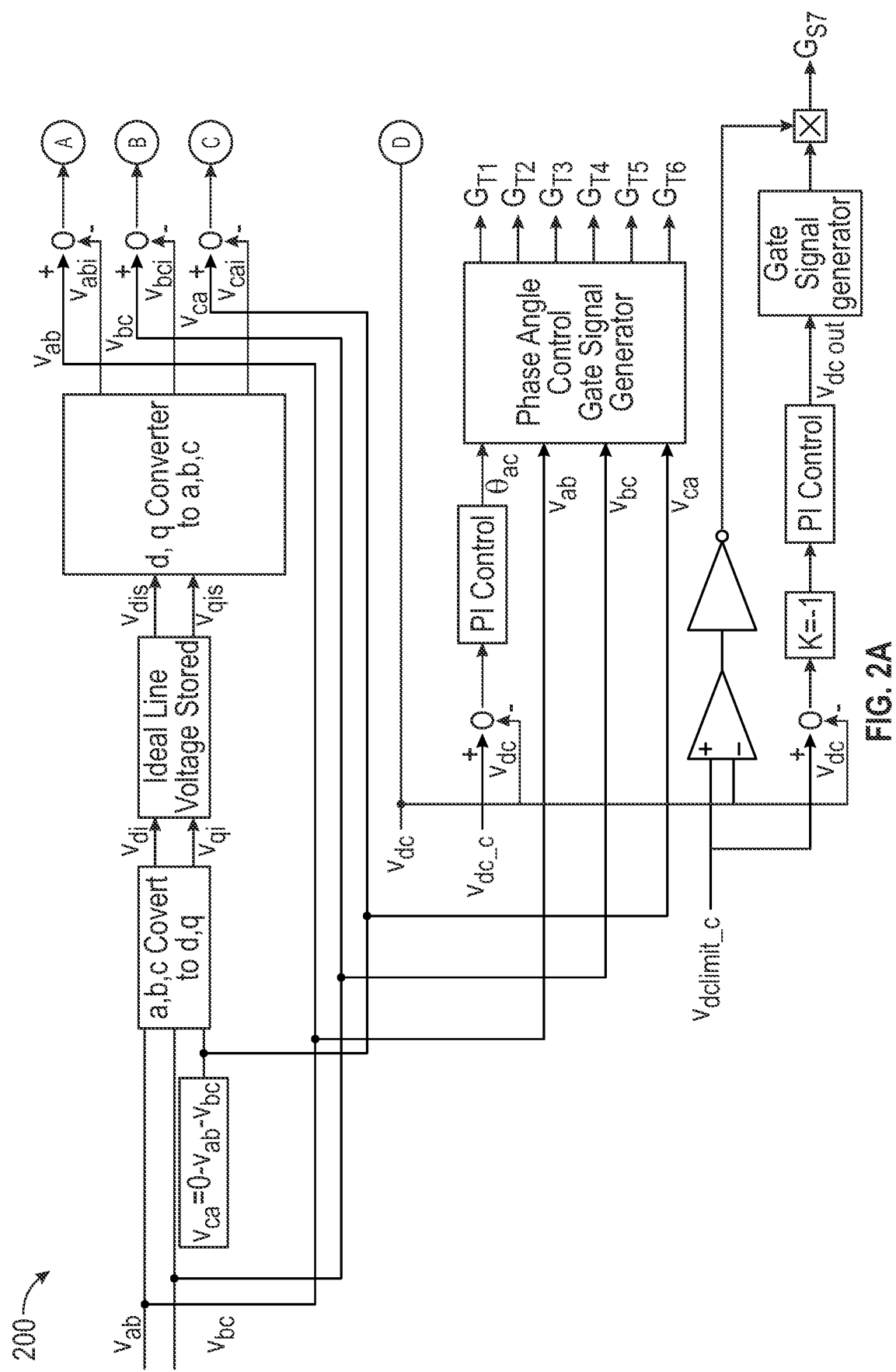
FIGS. 2A-2B depict a control circuit of a VUC in accordance with one or more example embodiments of the disclosure.
Figure 2B:
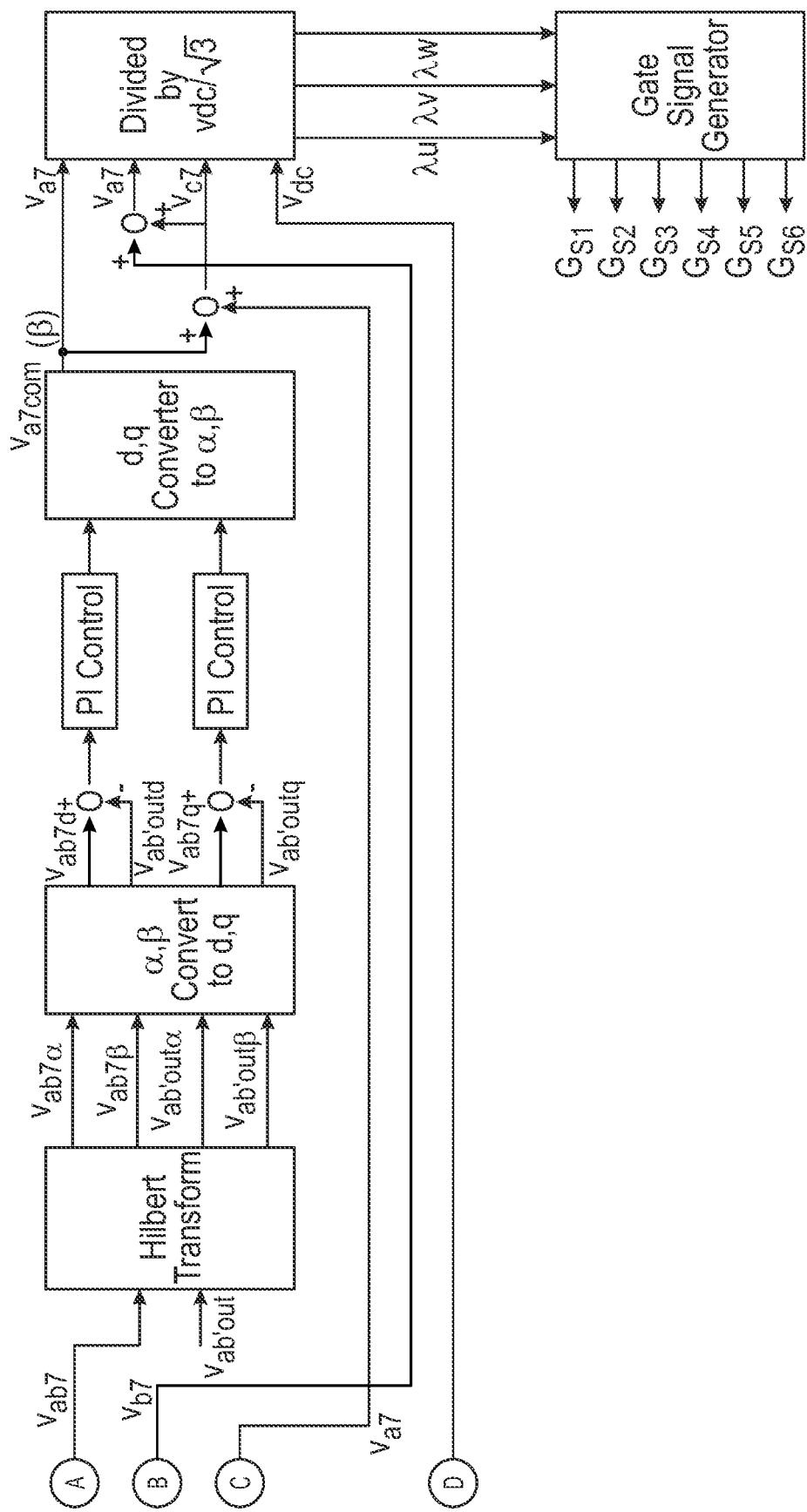

FIGS. 2A-2B show a control system 200 that may be used to maintain balanced voltages (e.g., remove voltage unbalanced as described above) across the windings of the machine 102. The control block diagram for the VUC 101 may be comprised of three parts: line voltage control, direct current (DC) link voltage control, and discharge control, however, in some embodiments any other number or combination of controller portions may be used as well. The line voltage control may operate the compensating voltage for unbalanced voltages. The DC link voltage control may maintain the DC link voltage for driving the inverter. The discharge controller may work to discharge the DC link capacitor to suppress an increase of the DC link voltage.

Figure 3A:
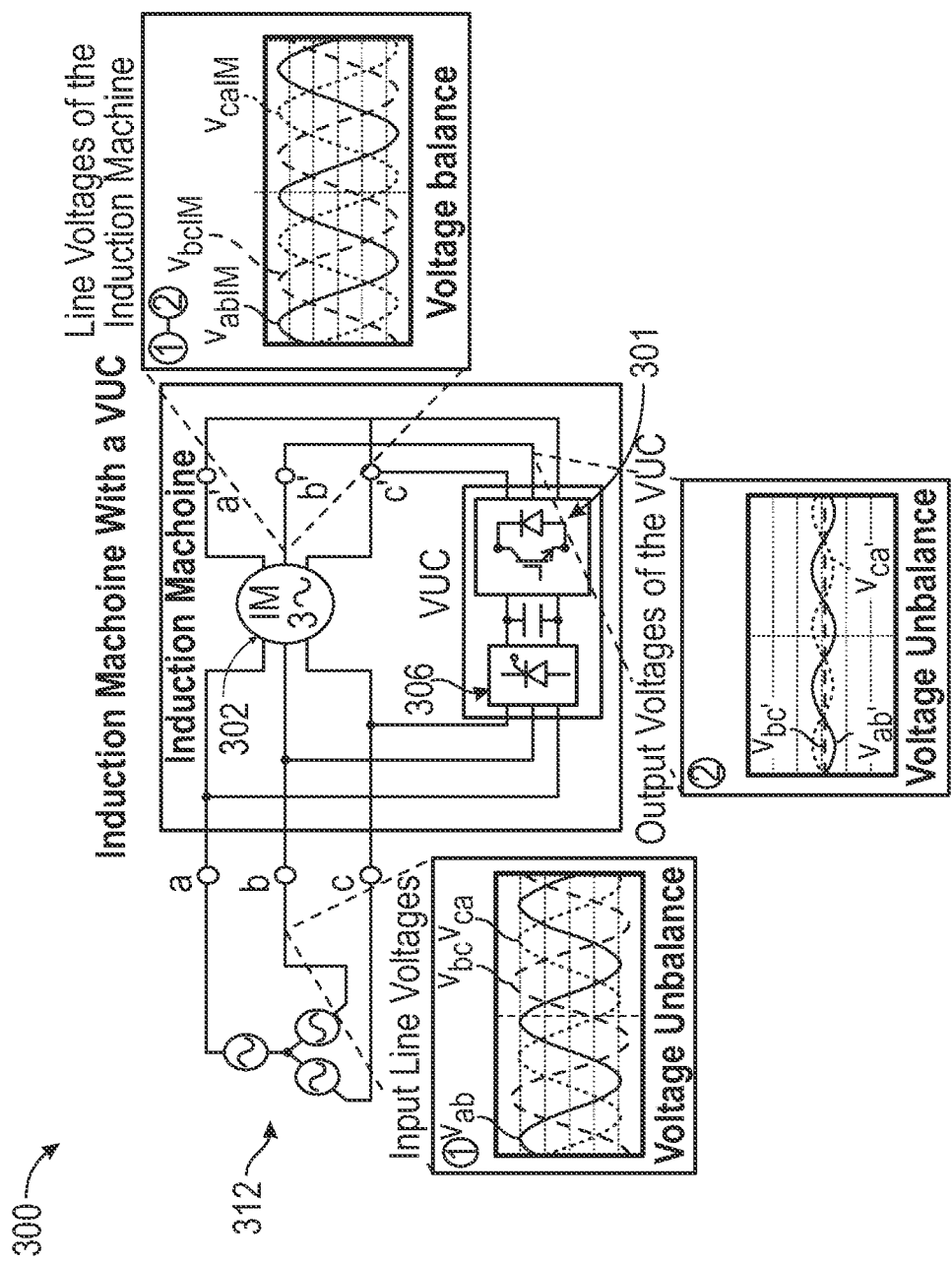
FIG. 3A depicts a simplified circuit diagram for an induction machine equipped with VUC in accordance with one or more example embodiments of the disclosure.

FIG. 3A depicts a system 300 (which may be a simplified version of system 100) to illustrate the basic principle of the control system 200 as presented in FIGS. 2A-2B. For example, system 300 may include a voltage source 312, a machine 302, and/or a VUC 301, which may be the same as voltage source 112, machine 102, and/or VUC 101. The system 300 may also include a thyristor bridge 306 and/or a PWM inverter 308. In FIG. 2, it may be shown that the PWM inverter 308 may be used to supply a voltage set on one side of the stator phases of the machine 302. As a result, the PWM inverter 308 may only need supply a voltage that is equivalent to the difference between a desired voltage (balanced voltage) and an identified unbalanced voltage. Thus, the voltage rating of the DC link and PWM inverter switches may only be a small fraction of the voltage rating of the machine and need only be equal, roughly, to the maximum value of voltage unbalance to be corrected.

In some embodiments, a thyristor bridge 306 may be used to feed the PWM inverter 308 and may convert the input AC voltage to a controlled DC link voltage. A DC link capacitor discharge circuit may be used to discharge the DC link capacitor when a voltage unbalance occurs which exceeds the rated voltage of the thyristor bridge 306. If desired, a second PWM inverter also can be used instead of the thyristor bridge 306, thereby eliminating the need for the discharge circuit. In addition, the switching loss also would increase compared to a thyristor bridge 306. Because the discharge circuit may only function when an unbalance voltage occurs significantly beyond the rated voltage of the machine 302 its size may remain relatively small.

Figure 3B:
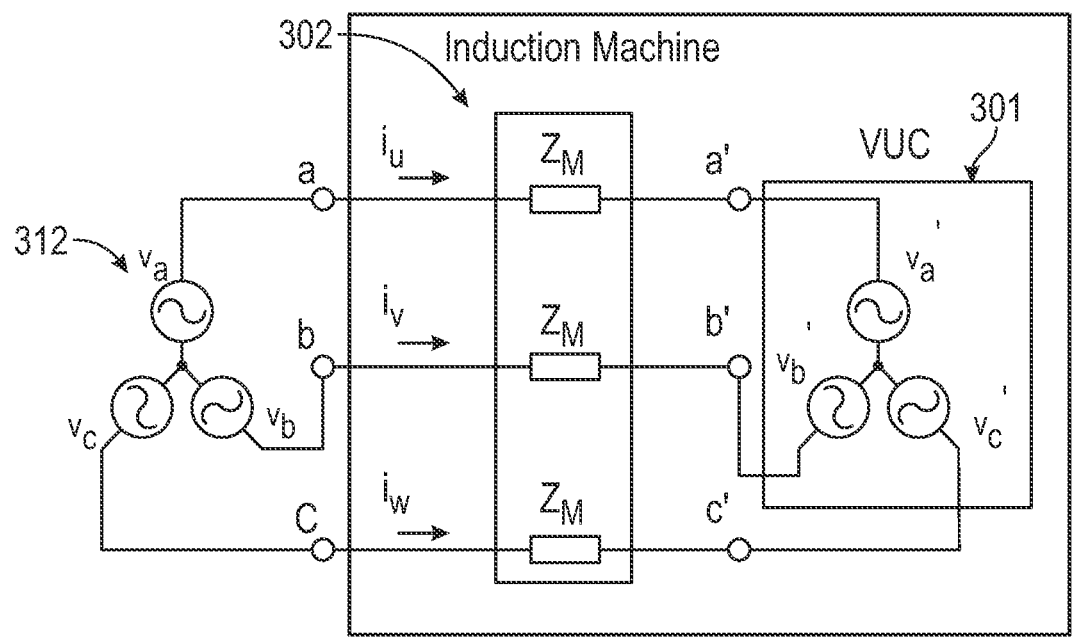
FIG. 3B depicts an induction machine equipped with VUC in accordance with one or more example embodiments of the disclosure.

FIG. 3B may depict a system 350, which may be another simplified version of the system 100 depicted in FIG. 1. As with FIG. 3A, FIG. 3B may depict a voltage source 312, a machine 302, and/or a VUC 301. FIG. 3B may serve as a reference point for how various variables with respect to system 100 may be determined. For example, $i_u$, $i_v$, and $i_w$ may represent currents being provided to the induction machine, and may be determined by Equations 1, 2, and 3. $E_0$ may be the neutral point voltage described as Equation 4. Quantities $v_a'$, $v_b'$, and $v_c'$ may be the output voltages of the PWM inverter (e.g., PWM inverter 308 described with respect to FIG. 3A as well as any other PWM inverter described herein). Quantities $v_a$, $v_b$ and $v_c$ may be voltages provided by the voltage source 312.

$$i_u = \{v_a - (v_a' + E_0)\}/Z_m \quad \text{(Equation 1)}$$

$$i_v = \{v_b - (v_b' + E_0)\}/Z_m \quad \text{(Equation 2)}$$

$$i_w = \{v_c - (v_c' + E_0)\}/Z_m \quad \text{(Equation 3)}$$

$$E_0 = (v_a/Z_m + v_b/Z_m + v_c/Z_m)/(1/Z_m + 1/Z_m + 1/Z_m) = \tfrac{1}{3}(v_a + v_b + v_c) \quad \text{(Equation 4)}$$

Ideal phase currents $i_{ui}$, $i_{vi}$ and $i_{wi}$ may be those that exist when the induction machine is driven directly by balanced voltage sources. They may be derived as Equation 5, Equation 6 and Equation 7. Note that $v_{ai}$, $v_{bi}$ and $v_{ci}$ may be ideal phase voltages.

$$i_{ui} = v_{ai}/Z_m \quad \text{(Equation 5)}$$

$$i_{vi} = v_{bi}/Z_m \quad \text{(Equation 6)}$$

$$i_{wi} = v_{ci}/Z_m \quad \text{(Equation 7)}$$

From the above equations, output phase voltages of the PWM inverter may be calculated as:

$$v_a' = v_a - E_0 - v_{ai} \quad \text{(Equation 8)}$$

$$v_b' = v_b - E_0 - v_{bi} \quad \text{(Equation 9)}$$

$$v_c' = v_c - E_0 - v_{ci} \quad \text{(Equation 10)}$$

If these output-phase voltages are used as command values by the control system 200, and are inserted into Equations 1, 2, and 3, ideal motor current values may be obtained as Equations 5, 6, and 7. However, these command values may not be able to be utilized because the neutral voltage $E_0$ may not be known. The neutral voltage $E_0$ may often be measured by accessing the neutral point voltage of machine. However, one may not be able access the neutral point of the voltage sources. Hence, phase voltage control may not be able to be employed, and line voltage control may have to be used in order to avoid needing to know the neutral voltage.

The command output line voltage of inverter $v_{ab}'$, $v_{bc}'$ and $v_{ca}'$ can be derived as Equations 11, 12, and 13 from the subtracting Equations 8-9, 9-10, and 10-8, respectively.

$$v_{ab}' = v_{ab} - v_{abi} \quad \text{(Equation 11)}$$

$$v_{bc}' = v_{bc} - v_{bci} \quad \text{(Equation 12)}$$

$$v_{ca}' = v_{ca} - v_{cai} \quad \text{(Equation 13)}$$

The $v_{ab}$, $v_{bc}$, and $v_{ca}$ may know the source line voltages. The quantities $v_{abi}$, $v_{bci}$, and $v_{cai}$ may be ideal line voltages assuming line voltages are balanced. Note that the neutral voltage $E_0$ may not be required in Equations 11, 12, and 13.

Though the PWM inverter may only be able to supply the line voltage, the command phase voltage $v_a'$, $v_b'$, and $v_c'$ may still be required to control the output line voltage of the inverter. Therefore, the command output phase voltage of the inverter $v_a'$ may be calculated from the results of PI control of the output line voltage about $v_{ab}'$ and $v_{about}$. The command output line voltage of the inverter $v_{ab}'$ and measured output line voltage of the inverter $v_{about}$ may be used for line voltage PI control. Then the output of PI control may be named as $v_{acom}$, the $v_{acom}$ may be used as the command output phase voltage of inverter $v_a'$. From the equations that relate the line voltage and phase voltage, the command output phase voltage of inverter may be calculated, so that finally:

$$v_a' = v_{acom} \quad \text{(Equation 14)}$$

$$v_c' = v_{ca}' + v_{acom} \quad \text{(Equation 15)}$$

$$v_b' = v_{bc}' + v_c' = v_{bc}' + v_{ca}' + v_{acom} \quad \text{(Equation 16)}$$

The command output phase voltages may be made by the command output line voltage of inverter and output of the PI control. Note that a coordinate transform may be used to accomplish the PI control because a dq-axes representation is utilized as shown the FIG. 3A. The control may require that the two input waveforms have a 90-degree phase difference.

The ideal line voltages $v_{abi}$, $v_{bci}$ and $v_{cai}$ may be obtained from the measured line voltage of tri phase sinusoidal voltage sources during balance voltage. The line voltages may be measured and stored as ideal dq-axes values during periods of balanced voltage. Consequently, the ideal line voltages $v_{abi}$, $v_{bci}$ and $v_{cai}$ may be calculated based on these stored values.

Four voltage sensors may be needed to control the VUC 301. Two voltage sensors may be used for measuring the line voltages of the polyphase voltage sources. Note that summation of the line voltages may be equal to zero even during unbalance voltage, so that if two line voltages are measured by voltage sensor, the remaining one can be calculated based on these measured values. One voltage sensor may be used for measuring the output line voltage of the inverter $v_{about}$. Lastly, one voltage sensor may be used for measuring the DC link voltage. It may be used for both line voltage control and DC link voltage control.

Next, DC link voltage control is described. The DC link voltage may be controlled by a thyristor bridge. The command of DC link voltage may be expressed by:

$$v_{dc\_c} = 3/\pi \times \sqrt{2} \times V_{ab} \quad \text{(Equation 17)}$$

The command value of the ideal DC link voltage may be calculated from the output of the diode bridge during conditions of balanced voltage. The command of phase angle of the thyristor bridge may be determined by the output of the DC link voltage PI control as shown the FIG. 2. When the DC link voltage control fails because the input line voltage drops due to an unbalanced voltage condition, the command phase angle may be set zero so that the thyristor bridge then simply operates as a three-phase diode bridge.

The discharge circuit may only operate when the DC link voltage increases beyond the DC link voltage limitation $V_{dclimit\_c}$. Here, the limitation value may be set from Equation 17 to be the rated voltage of the DC link capacitor $V_{dcrated}$. The limitation value may be expressed in Equation 18. The coefficient of $k_{dc}$ may represent the voltage range used in the VUC.

$$V_{dclimit\_c} = k_{dc} \times V_{dcrated} \quad \text{(Equation 18)}$$

Simulation Results

Figure 4:
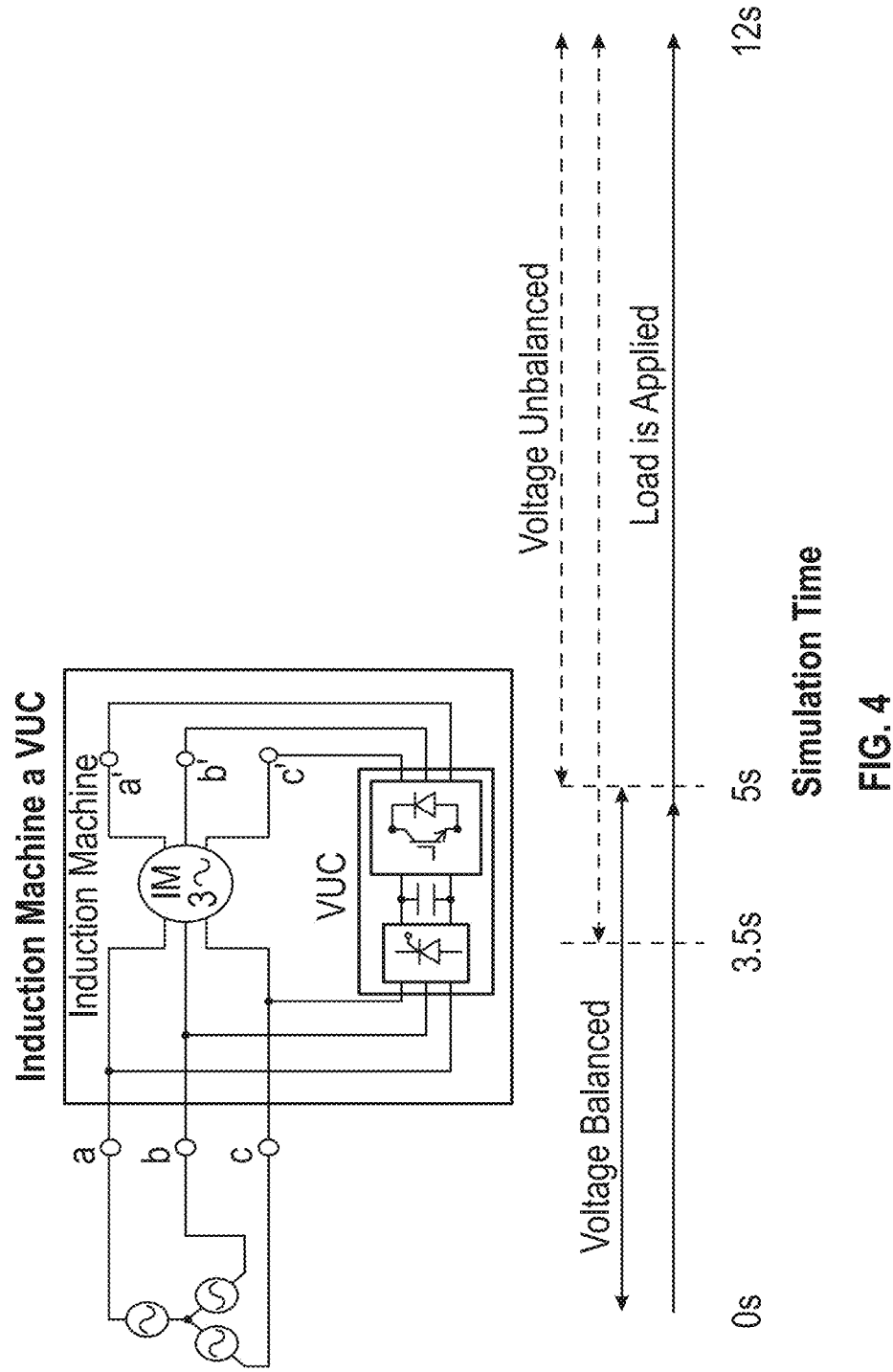
FIG. 4 depicts a simulation condition for study of an induction machine with a VUC in accordance with one or more example embodiments of the disclosure.

FIGS. 4-9B pertain to simulations used to validate the effectiveness of the VUC as described above. FIG. 4 illustrates the basic simulation strategy. The total simulation time may be set to 12, and a balanced voltage period may occur from 0 s to 5 s (for example, a period of the simulation during which a voltages provided to an induction machine are balanced). The unbalanced voltage period may start from 5 s and may end at 12 s (for example, this may represent a period of time during which a voltage imbalance is reduced to test the effectiveness of the VUC). The induction machine with the VUC may be operated from is to 12 s. The rated operation for the induction machine starts from 3.5 s to 12 s. Before it starts to drive, initial charging for the DC link capacitor may be finished charging during the first second. The command ideal line voltages may also be computed and stored during one second to drive the VUC.

Two simulation conditions were conducted to investigate the operation of the induction machine with the VUC. Simulation I shows a case where only one phase voltage is changed, and the voltage unbalance ratio is changed. Simulation II is a condition in which two or three phase source voltages are changed, and corresponding unbalanced voltages occur.

For the purpose of simulation, a 15 kW class induction machine model was used and was selected as a middle capacity size induction machine. The induction machine parameters were derived based on a NEMA B model. Table I lists the induction machine parameters used in the study.

TABLE I

INDUCTION MACHINE PARAMETERS

| Parameters | | Values |
|---|---|---|
| Rated power $P_{out}$ | [kW] | 15 |
| Rated voltage $V_a$ | [V] | 240 |
| Rated current $I_a$ | [A] | 44 |
| Pole number | — | 4 |
| Rated frequency $f_e$ | [Hz] | 60 |
| Stator resistance $R_s$ | [Ω] | 0.115 |
| Rotor resistance $R_r$ | [Ω] | 0.092 |
| Magnetizing inductance $L_m$ | [mH] | 25 |
| Leakage inductance of stator $L_{1s}$ | [mH] | 0.885 |
| Leakage inductance of rotor $L_{1s}$ | [mH] | 0.885 |
| Leakage impedance of stator $X_{1s}$ | [Ω] | 0.334 |
| Leakage impedance of rotor $X_{1r}$ | [Ω] | 0.334 |
| Magnetizing impedance $X_m$ | [Ω] | 9.427 |

Voltage sources were chosen to also consider the influence of the impedance of the power grid. The impedances of the power grid were assumed balanced and that changing the phase voltages only causes unbalanced voltages in the simulation and not the impedances. Table II lists the detail of the simulation conditions for simulation case I and simulation case II.

Figure 5:
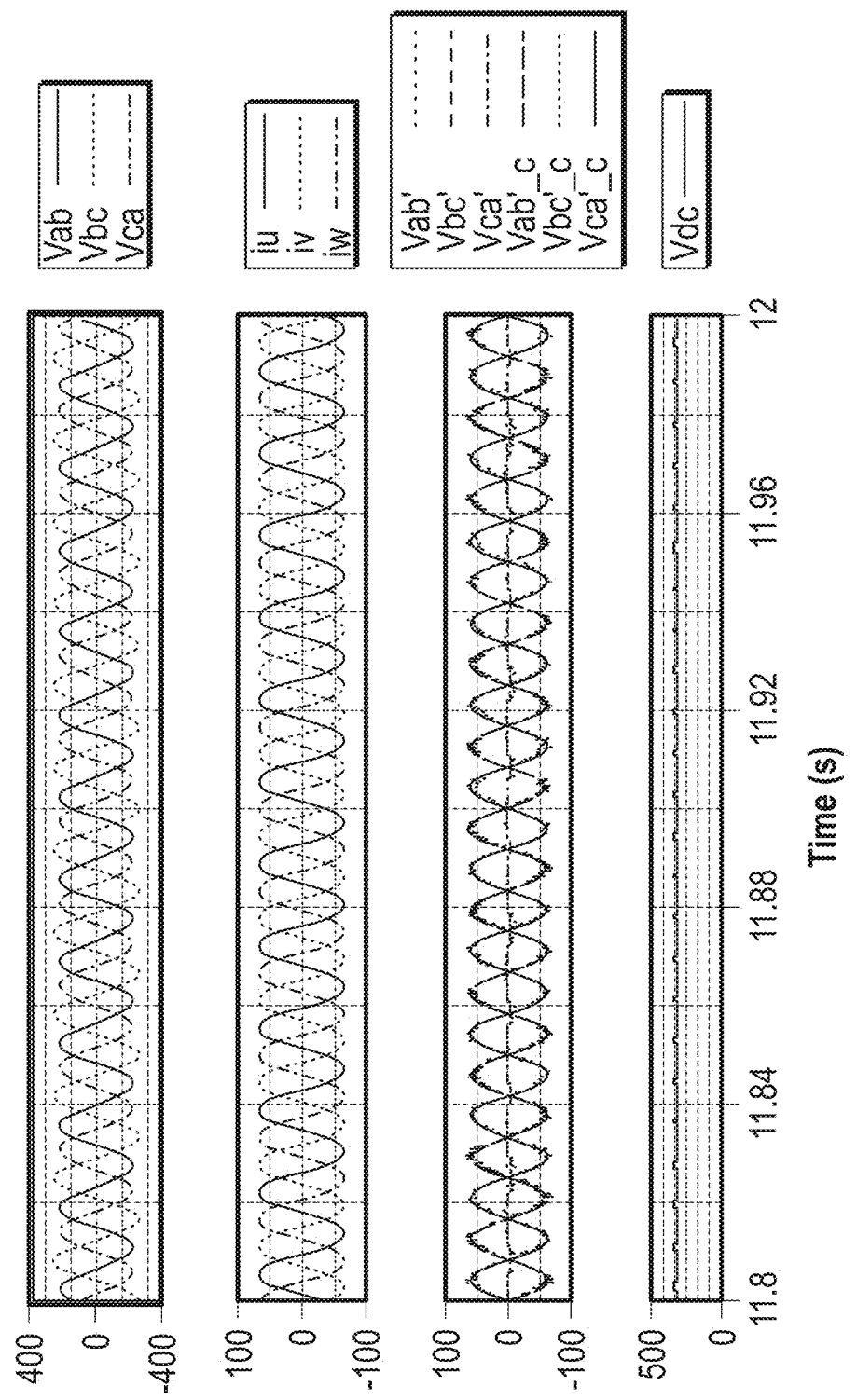
FIG. 5 depicts simulation results when the phase voltage decreases to 70% in accordance with one or more example embodiments of the disclosure.

FIG. 5 shows the simulation results when only the source phase voltage a is dropped to 70%. Note that the motor currents, $i_u$, $i_v$, and $i_w$ remain balanced even during the voltage unbalance. After examining a multitude of cases, it was clear that the VUC can compensate for any type of single-phase unbalanced voltage. From the results, the inverter of compensator is able supply the desired line voltages following the commanded line voltages of the inverter. In addition, the DC link voltage was also controlled constantly by using the thyristor bridge.

TABLE II

SIMULATION CONDITIONS

| Parameters | Values |
|---|---|
| Analysis total time | 12 s |
| Time step | 6.7 us |
| Simulation I: | Two phase voltage: 138.6 V, only |
| Input phase voltage $v_a$, $v_b$, $v_c$ | one phase voltage $v_a$: unbalanced |
| | (i) Only Phase a: 207.8 V(150%) |
| | (ii) Only Phase a: 180.1 V(130%) |
| | (iii) Only Phase a: 152.4 V(110%) |
| | (iv) Only Phase a: 124.7 V(90%) |
| | (v) Only Phase a: 97.0 V(70%) |
| | (vi) Only Phase a: 83.1 V(60%) |
| | (vii) Only Phase a: 69.3 V(50%) |
| | (viii) Only Phase a: 55.4 V(40%) |
| | (ix) Only Phase a: 41.6 V(30%) |
| | Note: phase angle no change. |
| Simulation II: | (i) $v_a$ = 124.7 V(90%), $v_b$ = 117.8 |
| Input phase voltage $v_a$, $v_b$, $v_c$ | V(85%), $v_c$ = 138.6 V(100%) |
| Note: two or three phase | (i) $v_a$ = 124.7 V(90%), $v_b$ = 124.7 |
| voltages are changed. | V(90%), $v_c$ = 117.8 V(85%) |
| | Note: phase angle no change |
| Frequency of input voltage | 60 Hz |
| Power grid impedance $L_g$ and $R_g$ | 10 uH, 10 mΩ |
| Resistances for initial charge of DC link capacitor $R_{in}$ | 5Ω |
| Reactors connected to the Thyristor $L_T$ and $R_T$ | 10 mH, 10 mΩ |
| Reactor of discharge circuit $L_{dis}$ and $R_{dis}$ | 10 mH, 10 mΩ |
| DC link capacitor $C_{dc}$ and $R_{dc}$ | 3000 uF, 10 mΩ |
| Induction machine | 15 kW (parameters are listed in Table 1) |

TABLE II-continued

SIMULATION CONDITIONS

| Parameters | Values |
|---|---|
| Switching frequency of Thyristor | 60 Hz |
| Switching frequency of inverter (IGBT) | 2 kHz |
| Switching frequency of discharge circuit (IGBT) | 2 kHz |
| Control method of the subcircuit | Inverter: Line voltage PI control<br>Thyristor: DC link voltage PI control<br>Discharge circuit: Discharge control of DC link capacitor |
| Period of voltage unbalanced | 5 s to 12 s |
| Period of rated operation of the induction machine | 3.5 s to 12 s |
| Command of the DC link voltage $v_{dc\_c}$ | 324 V |
| Limitation of the DC link voltage $v_{dclimit\_c}$ | 350 V |

Figure 6:
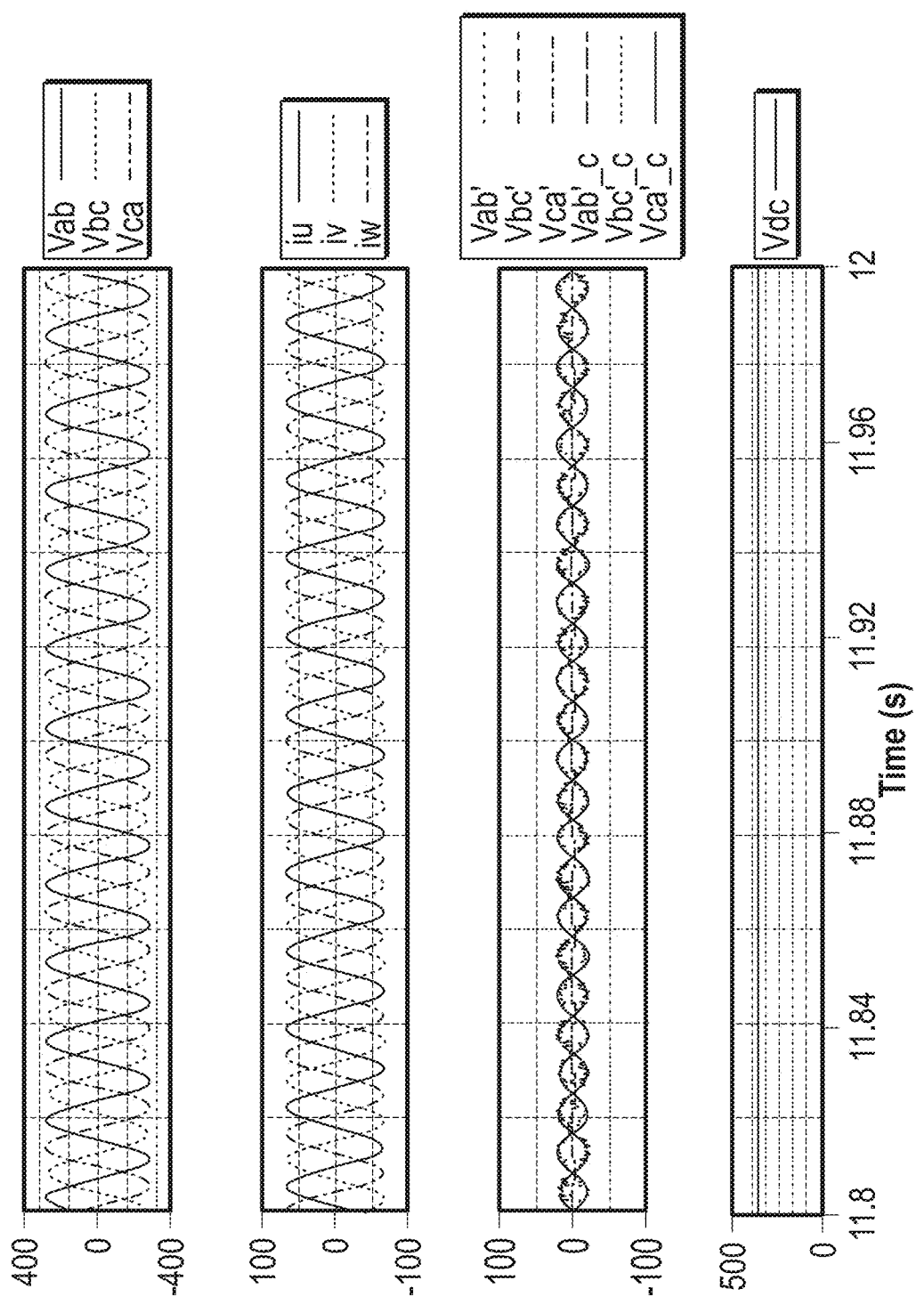
FIG. 6 depicts simulation results when the phase voltage increases to 110% in accordance with one or more example embodiments of the disclosure.

FIG. 6 shows the simulation results for a voltage surge when phase a voltage is increased to about 110% of the rated voltage. As a result, voltage unbalance again occurs. However, the motor currents, $i_u$, $i_v$ and $i_w$ remain balanced and the VUC is again able to compensate for the unbalance voltages. The command output of line voltages of inverter and actual voltages across the motor phases match well. The DC link voltage was also controlled constantly by using the thyristor bridge and discharge circuit.

Figure 7:
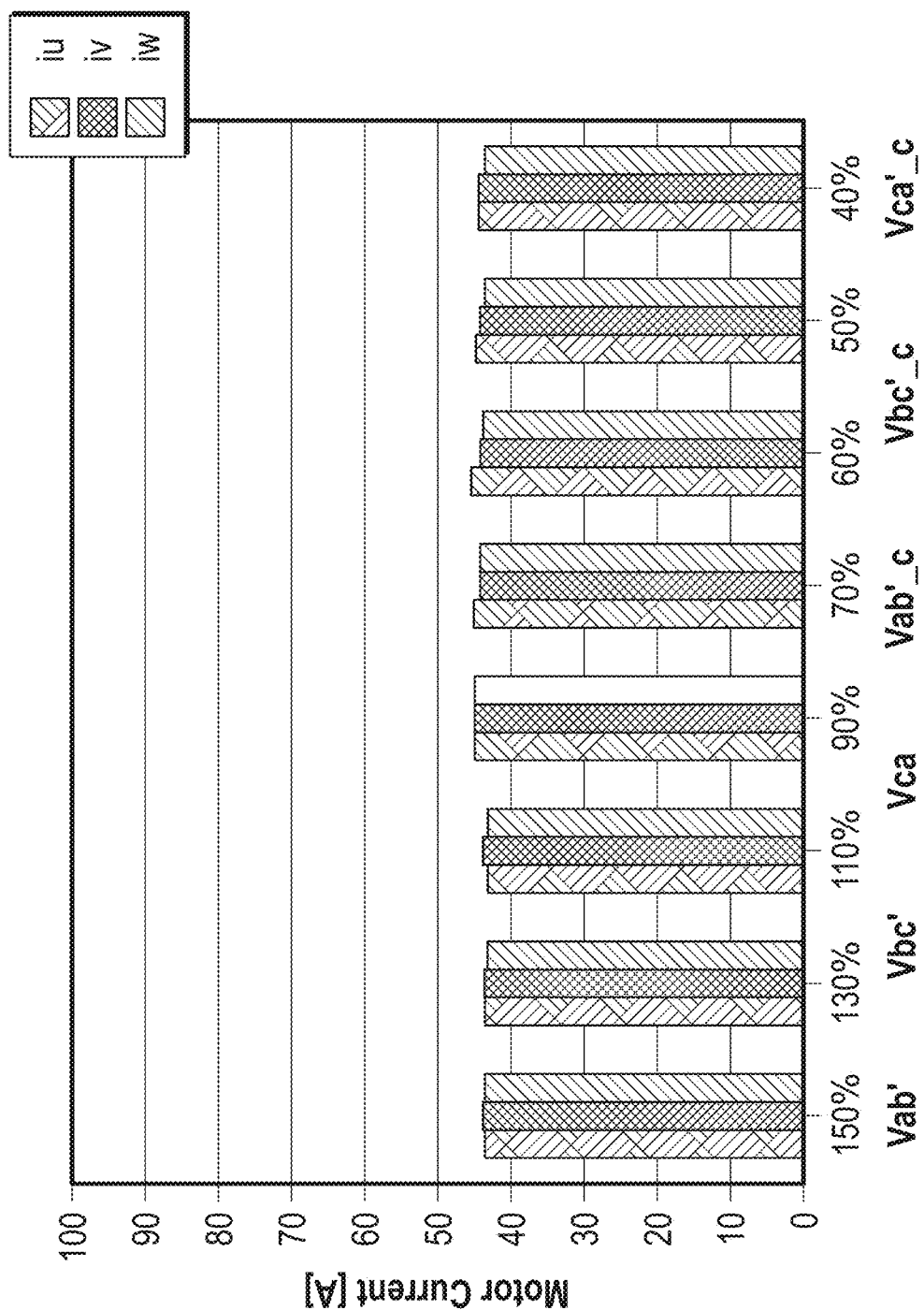
FIG. 7 depicts the motor current amplitudes when the voltage unbalance ratio is changed (Simulation I) in accordance with one or more example embodiments of the disclosure.
Figure 8:
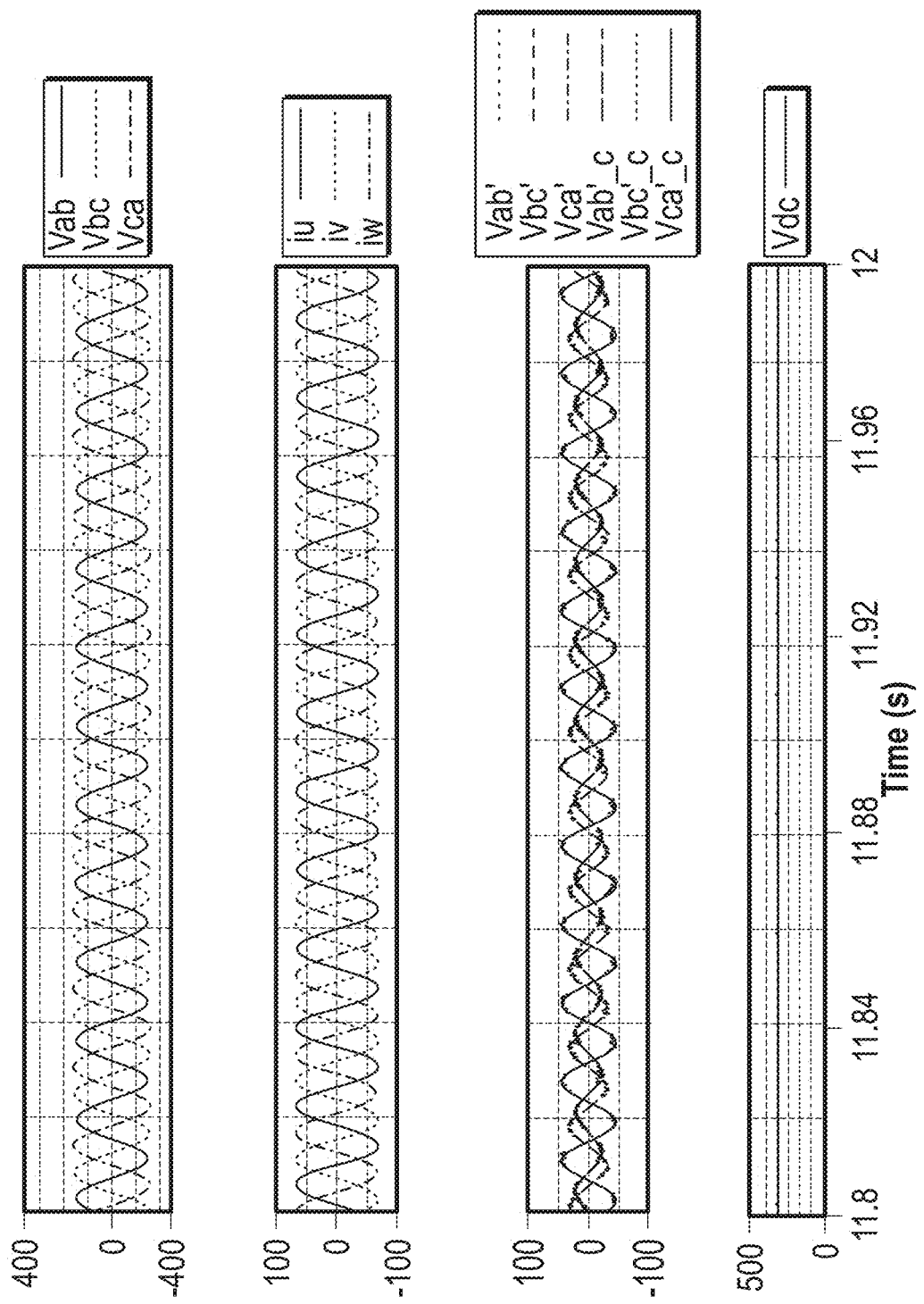
FIG. 8 depicts simulation results when two-phase voltages are dropped in accordance with one or more example embodiments of the disclosure.

FIG. 7 shows the motor currents (e.g., simulation I) when the voltage unbalance ratio was changed. From this result, the motor currents were again completely balanced during all the simulation conditions. Furthermore, amplitude of motor currents was completely same as rated motor current. It means that the rated motor operation was not affected by the operation of the VUC. From the result, it was evident the validity of the control method of the VUC. However, when one of the phase voltages drops to about 30% of the rated voltage, balance of the motor currents could not be maintained. This was caused by the fact that the VUC cannot supply the correct value of compensating voltages since the thyristor bridge is unable to receive enough power to drive the inverter to its desired value.

Figure 9A:
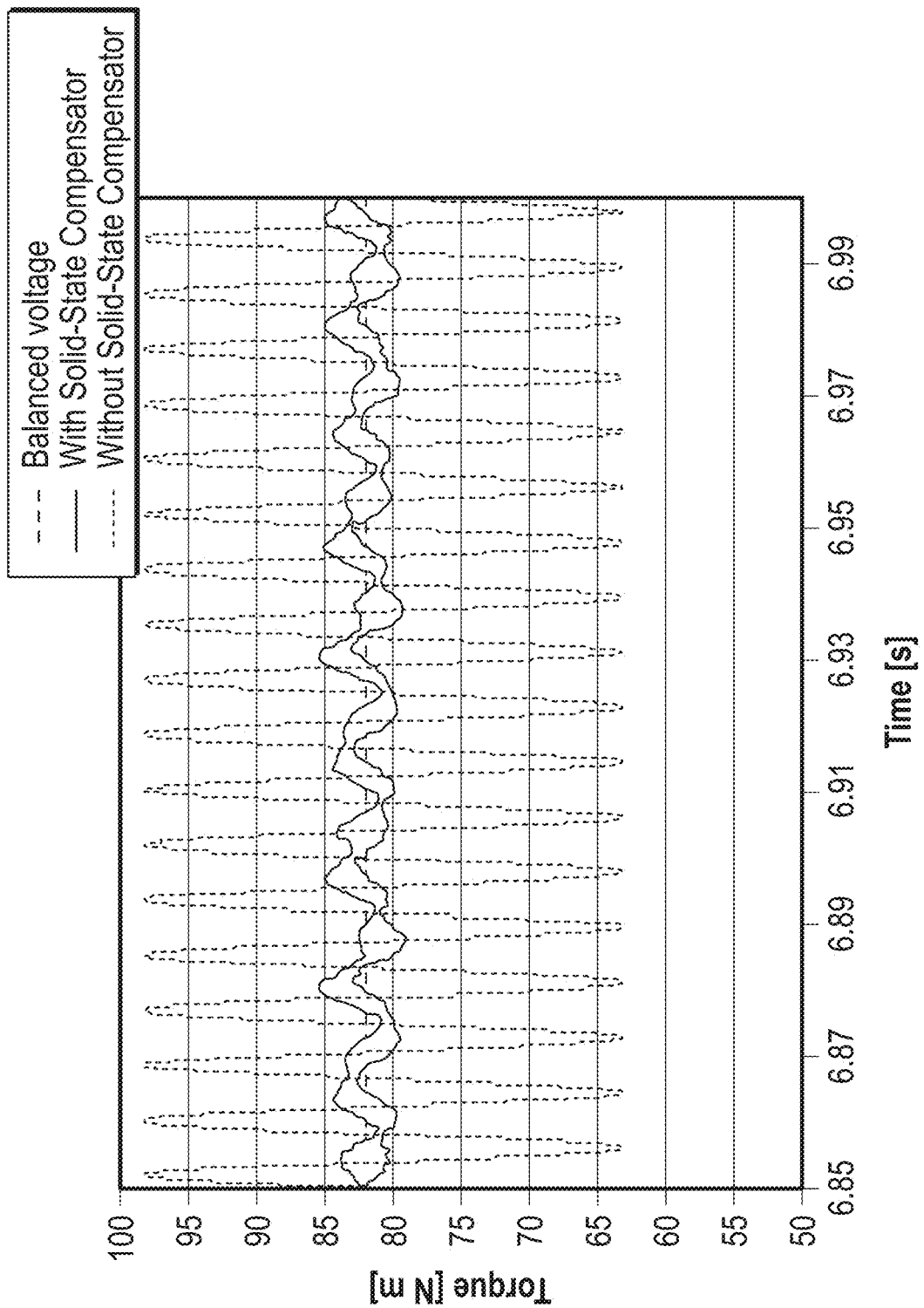
FIG. 9A depicts torque waveforms when the one-phase voltage was changed to 70% of rated voltage in accordance with one or more example embodiments of the disclosure.
Figure 9B:
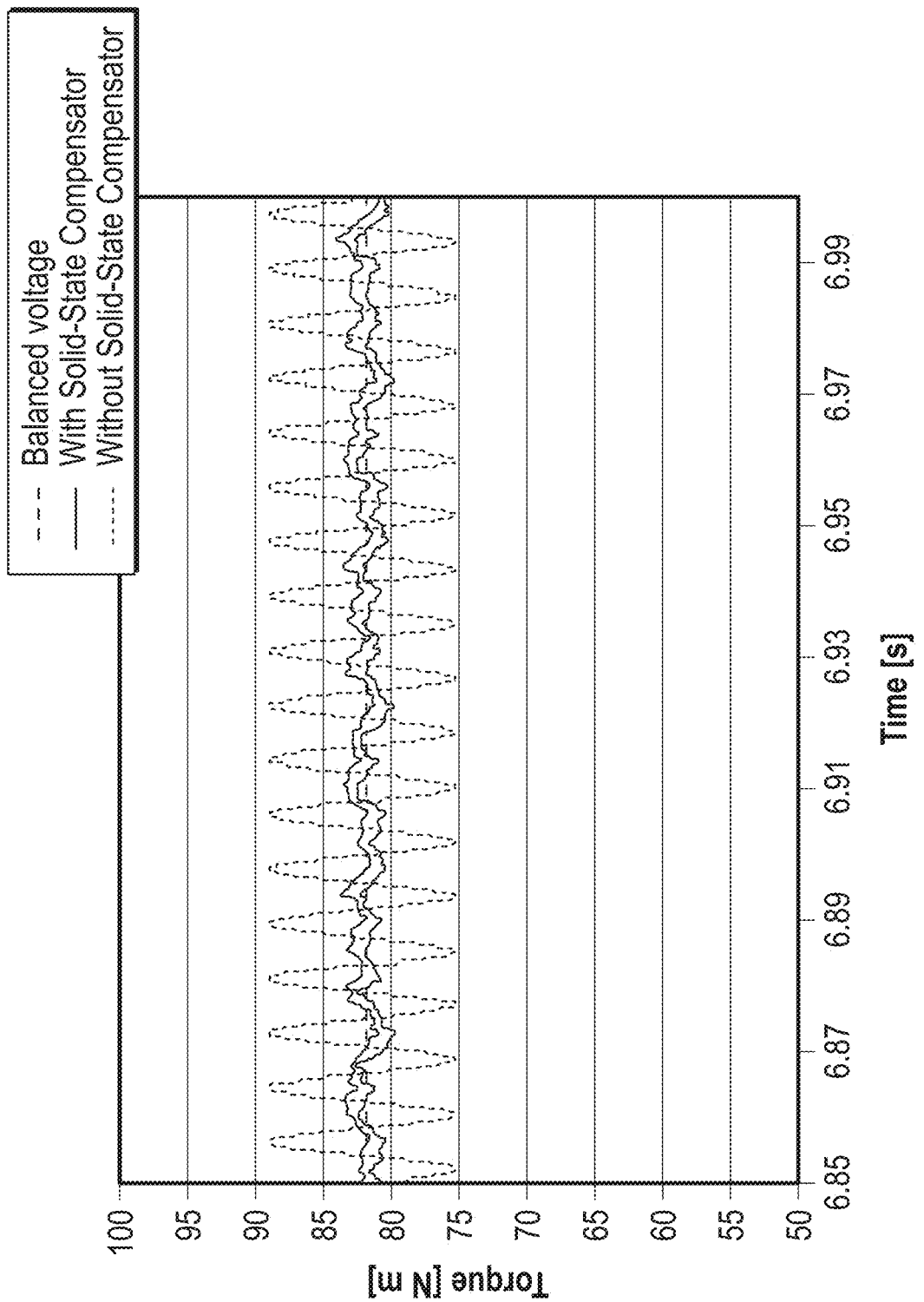
FIG. 9B depicts torque waveforms when the one-phase voltage was changed to 110% of rated voltage in accordance with one or more example embodiments of the disclosure.

FIGS. 9a and 9b show the torque waveforms when the one of the phase voltages was changed to 70% and to 110% of rated voltage, respectively. Normal torque is also illustrated in the figure when the voltages maintain balance. From the results, solid-state compensator enables one to keep torque constant to within four percent rated torque. On the other hand, the torque fluctuates 23% and nine percent rated torque respectively without the solid-sate compensator. The effectiveness of the proposed approach is evident from these results.

Various illustrative embodiments have been discussed above. These and other example embodiments of the disclosure will be described in more detail hereinafter through reference to the accompanying drawings. The drawings and the corresponding description are provided merely for illustration and are not intended to limit the disclosure in any way. It should be appreciated that numerous other embodiments, variations, and so forth are within the scope of this disclosure.

Example Methodology

Figure 10:
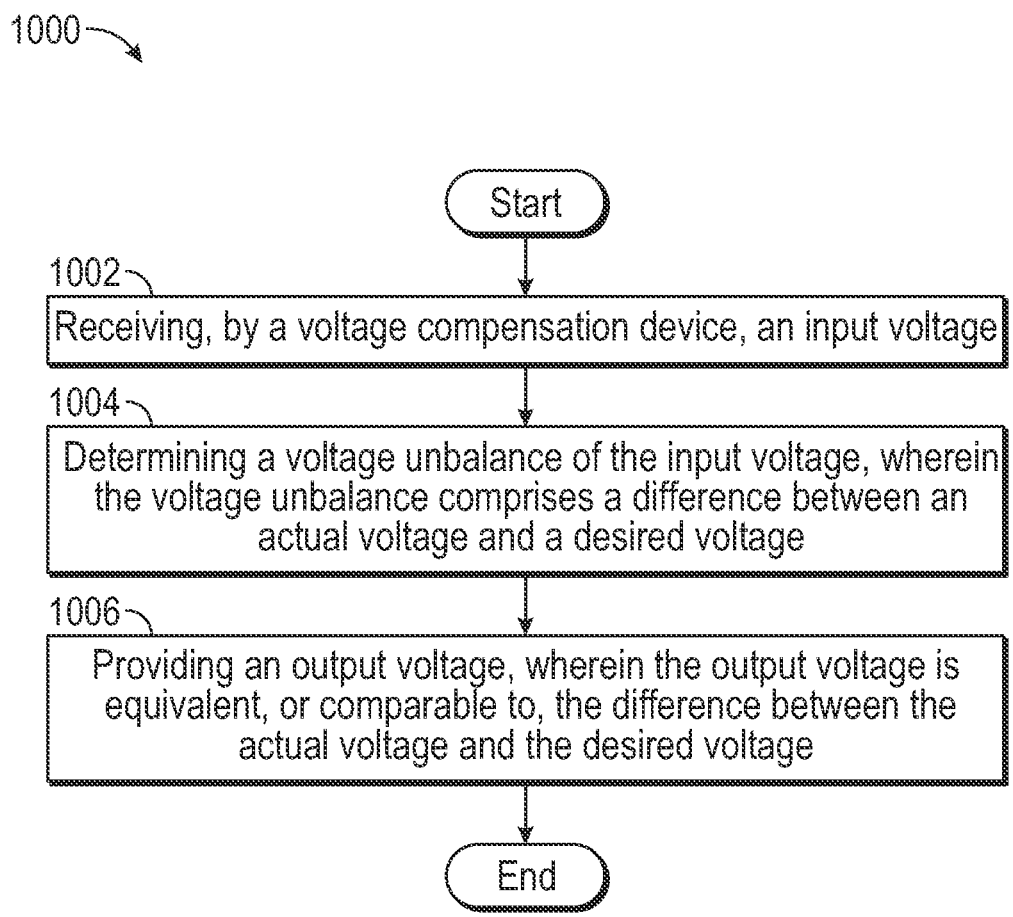
FIG. 10 illustrates a flow diagram of an example process in accordance with one or more example embodiments of the disclosure.

FIG. 10 illustrates a flow diagram of an example process 1000 in accordance with one or more embodiments of the disclosure.

In various embodiments, block 1002 may comprise receiving an input voltage. In some embodiments, the input voltage may be received from a voltage source. The voltage source may provide a three-phrase voltage, for example for use with a three-phrase machine (e.g., an induction machine, which may be the same as machine 102 described with respect to FIG. 1 above). The input voltage may be received by a machine, such as an induction machine. The input voltage may also be received by a voltage compensation device, which may be connected in parallel with the machine. The input voltage may be received by a first set of three phase inputs on the machine. The machine may have a total of six inputs, which may allow the machine to receive two three-phase voltage inputs.

In various embodiments, block 1004 may comprise determining a voltage unbalance of the input voltage, wherein the voltage unbalance comprises a difference between an actual voltage and a desired voltage. In some embodiments, the unbalance determination may be made by the voltage compensation device. For example, the voltage compensation device may comprise a control system capable of making such determinations (for example, the control system depicted in FIG. 2). The voltage unbalance may exist across all three of the three-phase voltage lines, or may only exist on one of the voltage phase lines.

In various embodiments, block 1006 may comprise providing an output voltage, wherein the output voltage is equivalent, or comparable to, the difference between the actual voltage and the desired voltage. In some embodiments, the output voltage may be provided by the voltage compensation device to the machine. The output voltage may be provided to a second set of three-phase inputs included on the machine. The output voltage may serve to compensate for the unbalances in the input voltage received by the machine in the first set of three-phase inputs. Thus, the combination of the input voltage and the output voltage from the voltage compensation device may result in a combined voltage that is equivalent to or close to the desired voltage of the machine.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

The disclosure is described above with reference to block and flow diagrams of systems, methods, apparatuses, and/or computer program products according to example embodiments of the disclosure. It will be understood that one or more blocks of the block diagrams and flow diagrams, and combinations of blocks in the block diagrams and the flow diagrams, respectively, can be implemented by computer-readable program instructions. Likewise, some blocks of the block diagrams and flow diagrams may not necessarily need to be performed in the order presented or may not necessarily need to be performed at all, according to some embodiments of the disclosure.

Various block and/or flow diagrams of systems, methods, apparatus, and/or computer program products according to example embodiments of the disclosure are described above. It will be understood that one or more blocks of the block diagrams and flow diagrams, and combinations of blocks in the block diagrams and flow diagrams, respectively, can be implemented by computer-readable program instructions. Likewise, some blocks of the block diagrams and flow diagrams may not necessarily need to be performed in the order presented or may not necessarily need to be performed at all, according to some embodiments of the disclosure.

Accordingly, blocks of the block diagrams and flow diagrams support combinations of means for performing the specified functions, combinations of elements or operations for performing the specified functions and program instruction means for performing the specified functions. It will also be understood that each block of the block diagrams and flow diagrams, and combinations of blocks in the block diagrams and flow diagrams, can be implemented by special purpose, hardware-based computer systems that perform the specified functions, elements or operations, or combinations of special purpose hardware and computer instructions.

Many modifications and other embodiments of the disclosure set forth herein will be apparent having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system, comprising:
   an induction machine comprising a first input for receiving a three-phase voltage from a three-phase voltage source; and
   a voltage unbalance compensation device (VUC) connected in parallel with the induction machine, wherein the VUC is configured to:
   receive, at a second input, the three-phase voltage from the three-phase voltage source;
   determine a voltage unbalance between any of the three phases of the three-phase voltage; and
   output a second voltage to the second input of the induction machine, wherein the second voltage is supplemental to the three-phase voltage and compensates for the determined voltage unbalance in the three-phase voltage received at the first input from the three-phase voltage source.

2. The system of claim 1, wherein a value of the second voltage that is output by the VUC is equal to a difference between an ideal voltage value and an unbalanced voltage value resulting from the voltage unbalance.

3. The system of claim 1, further comprising a thyristor bridge circuit connected in parallel with the first PWM inverter circuit.

4. The system of claim 3, further comprising a direct current (DC) link capacitor and discharge circuit connected in parallel with the thyristor bridge circuit.

5. The system of claim 1, further comprising a second PWM inverter circuit connected in parallel to the first PWM inverter circuit.

6. The system of claim 1, further comprising a control circuit comprising a line voltage control, a direct current (DC) link voltage control, and a discharge control.

7. A voltage unbalance compensation device comprising:
   a first input of the voltage unbalance compensation device connected to an output of a power source;
   an output connected to a first input of an induction machine, the induction machine comprising the first input and a second input, wherein the second input of the induction machine is also connected to the output of the power source; and a control circuit configured to:
receive a voltage input from the power source, determine a voltage unbalance between a first phase of the voltage input and a second phase of the voltage input, and output a second voltage to the first input of the induction machine to compensate for a voltage unbalance in the voltage input that is also received at the second input of the induction machine.

8. The voltage unbalance compensation device of claim 7, wherein the voltage unbalance compensation device is connected in parallel with the induction machine.

9. The voltage unbalance compensation device of claim 7, wherein the voltage unbalance compensation device further comprises a thyristor bridge circuit connected in parallel with a first PWM inverter circuit.

10. The voltage unbalance compensation device of claim 9, wherein the voltage unbalance compensation device further comprises a direct current (DC) link capacitor and discharge circuit connected in parallel with the thyristor bridge circuit.

11. The voltage unbalance compensation device of claim 7, wherein the voltage unbalance compensation device further comprises a second PWM inverter circuit connected in parallel to the PWM inverter circuit.

12. The voltage unbalance compensation device of claim 7, wherein the voltage unbalance compensation device further comprises a control circuit comprising a line voltage control, a direct current (DC) link voltage control and a discharge control.

13. The voltage unbalance compensation device of claim 7, wherein the induction machine comprises a first input and a second input, wherein the first input comprises a first voltage input and the second input comprises a second voltage input.

14. A method for compensating for voltage unbalance comprising the steps of:
receiving, by a voltage compensation device, an input voltage from a voltage source;
determining a voltage unbalance of the input voltage; and
providing an output voltage to a second input of an induction machine, wherein the output voltage is supplemental to the input voltage and compensates for the voltage unbalance in the input voltage, wherein the input voltage is also received from the voltage source at a first input of the induction machine.

15. The method of claim 14, further comprising:
sending the output voltage to a machine, wherein the machine also receives the input voltage, and wherein the output voltage compensates for the voltage unbalance.

16. The system of claim 1, wherein the VUC further comprises four voltage sensors.

17. The system of claim 16, wherein a first voltage sensor and a second voltage sensor are configured to measure line voltages associated with the voltage source, a third voltage sensor is configured to measure an output of the VUC, and a fourth voltage sensor is configured to measure a direct current (DC) link voltage.

* * * * *